United States Patent
Ocker et al.

(10) Patent No.: US 9,842,755 B2
(45) Date of Patent: Dec. 12, 2017

(54) METHOD AND SYSTEM FOR NATURALLY OXIDIZING A SUBSTRATE

(71) Applicant: SINGULUS TECHNOLOGIES AG, Kahl am Main (DE)

(72) Inventors: Berthold Ocker, Hanau (DE); Wolfram Maass, Linsengericht-Grossenhausen (DE)

(73) Assignee: Singulus Technologies AG, Kahl am Main (DE)

( * ) Notice: Subject to any disclaimer, the term of this patent is extended or adjusted under 35 U.S.C. 154(b) by 7 days.

(21) Appl. No.: 14/765,006

(22) PCT Filed: Feb. 18, 2014

(86) PCT No.: PCT/EP2014/053117
§ 371 (c)(1),
(2) Date: Jul. 31, 2015

(87) PCT Pub. No.: WO2014/131654
PCT Pub. Date: Sep. 4, 2014

(65) Prior Publication Data
US 2015/0380287 A1    Dec. 31, 2015

(30) Foreign Application Priority Data
Feb. 28, 2013  (EP) .................................. 13157239

(51) Int. Cl.
*C23C 16/46* (2006.01)
*H01L 21/673* (2006.01)
(Continued)

(52) U.S. Cl.
CPC ........ *H01L 21/67376* (2013.01); *C23C 16/46* (2013.01); *C23C 16/52* (2013.01);
(Continued)

(58) Field of Classification Search
CPC ... H01L 21/02; H01L 21/673; H01L 21/0223; H01L 21/67201; H01L 21/67376;
(Continued)

(56) References Cited

U.S. PATENT DOCUMENTS

| 6,797,323 B1 | 9/2004 | Kashiwagi et al. |
| 2010/0184267 A1 | 7/2010 | Kabe et al. |

FOREIGN PATENT DOCUMENTS

| JP | 11-186255 A | 7/1999 |
| JP | 2010-171128 A | 8/2010 |

OTHER PUBLICATIONS

International Search Report dated Apr. 4, 2014 from PCT/EP2014/053117, 3 pages.
(Continued)

*Primary Examiner* — Rodney McDonald
(74) *Attorney, Agent, or Firm* — Ohlandt, Greeley, Ruggiero & Perle, L.L.P.

(57) ABSTRACT

A system and method for treating a substrate in a reaction chamber. A transfer chamber is arranged between a first lock and a second lock, wherein the second lock is provided between the transfer chamber and the reaction chamber. A substrate is transferred into the transfer chamber through the first lock, and the first lock is closed. In a next step, the transfer chamber is flooded with the same gas as in the reaction chamber and the pressure and temperature of the gaseous atmosphere in the transfer chamber is controlled to be the same as in the reaction chamber. Then, the second lock is opened and the substrate is transferred from the transfer chamber into the reaction chamber to treat the substrate. A computer program product for carrying out the above method.

6 Claims, 2 Drawing Sheets

(51) Int. Cl.
  *H01L 21/02* (2006.01)
  *H01L 21/67* (2006.01)
  *H01L 31/18* (2006.01)
  *C23C 16/52* (2006.01)
(52) U.S. Cl.
  CPC .... *H01L 21/0223* (2013.01); *H01L 21/02233* (2013.01); *H01L 21/02238* (2013.01); *H01L 21/67201* (2013.01); *H01L 21/67389* (2013.01); *H01L 31/18* (2013.01); *H01L 31/1868* (2013.01); *Y02E 10/50* (2013.01); *Y02P 70/521* (2015.11)
(58) Field of Classification Search
  CPC ... H01L 21/67389; H01L 31/18; C23C 16/46; C23C 16/52
  USPC .................................. 204/298.25; 118/719
  See application file for complete search history.

(56) References Cited

OTHER PUBLICATIONS

Written Opinion dated Apr. 4, 2014 from PCT/EP2014/053117, 4 pages.
Extended European Search Report dated Jun. 17, 2013 from EP Application No. 13157239.8, 6 pages.
Japanese Office Action dated Apr. 4, 2017 from corresponding Japanese Patent Application No. 2015-559464, 9 pages.
International Preliminary Report on Patentability dated Sep. 1, 2015 from corresponding International Application No. PCT/EP2014/053117, 5 pages.

METHOD AND SYSTEM FOR NATURALLY OXIDIZING A SUBSTRATE

BACKGROUND

1. Field of the Disclosure

The present disclosure relates to a method and system for treating a substrate in a reaction chamber, particularly for naturally oxidizing the substrate. The substrate may be a wafer, for example, a silicon wafer, which may be coated with an oxygen-affine layer before the treatment in the reaction chamber.

2. Discussion of the Background Art

Substrates may be used for fabricating, for example, optical discs and/or semiconductor elements and/or semiconductor cells and/or parts thereof. In particular fabrication processes, oxidation of a substrate (for example, an already coated substrate) is preferred. In order to obtain an oxide layer of high quality on the substrate, it appears advantageous or even imperative to perform a gentle oxidation of the substrate in a well-defined atmosphere.

However, such a gentle oxidation may take too long to achieve an acceptable overall efficiency of such a treatment process, particularly if many substrates are to be treated sequentially, for example if each substrate is to be treated after it has been coated. Further, it might be advantageous that each of the substrates is to be treated differently after having been coated, for example, the first substrate is to be provided with a much thinner oxide layer than the second substrate.

Due to these reasons, the treatment of the substrates cannot be performed in an effective way if using the methods and devices known from the prior art, since such a treatment process only allows to treat the substrates one-by-one, particularly if it is preferred that the duration of the treatment may vary for the substrates.

U.S. Pat. No. 6,797,323 B1 discloses a method of forming a silicon oxide layer in the production of a semiconductor device.

In view of the above, the object underlying the present disclosure is to provide a method and/or system for accelerating the process of individually treating a plurality of substrates without decreasing the quality of the treatment.

These objects are achieved with the features of the present disclosure.

SUMMARY

The basic idea behind the present disclosure is to provide a method and system in which the particularly well-defined gaseous atmosphere in a reaction chamber can be maintained even if one or more substrates are transferred into the reaction chamber and/or from the reaction chamber into a further chamber. In doing so, it is possible to control and precisely pre-determine the duration of treatment of a substrate in the particular gaseous atmosphere and to individually treat a plurality of substrates at the same time for different durations.

In particular, the present disclosure relates to a method for treating a substrate in a reaction chamber. A transfer chamber is arranged between a first lock and a second lock, and the second lock is provided between the transfer chamber and the reaction chamber. Carrying out the method, a substrate is transferred through the first lock into the transfer chamber, and the first lock is closed. In a next step, the transfer chamber is flooded with the same gas as in the reaction chamber and the pressure and temperature of the gaseous atmosphere in the transfer chamber is controlled to be the same as in the reaction chamber. Then, the second lock is opened and the substrate is transferred from the transfer chamber into the reaction chamber to treat the substrate.

In an embodiment, the transfer chamber is arranged between a vacuum chamber (for example, a wafer transport module) and the reaction chamber, and the first lock is provided between the vacuum chamber and the transfer chamber, and the second lock is provided between the transfer chamber and the reaction chamber. In this case, carrying out the method, the substrate is provided in the vacuum chamber, and the pressure and temperature in the transfer chamber is controlled so that the pressure and the temperature are substantially the same as in the vacuum chamber. Then, the first lock is opened, the substrate is transferred from the vacuum chamber into the transfer chamber, and the first lock is closed. In a next step, the transfer chamber is flooded with the same gas as in the reaction chamber and the pressure and temperature of the gaseous atmosphere in the transfer chamber is controlled to be the same as in the reaction chamber. Then, the second lock is opened and the substrate is transferred from the transfer chamber into the reaction chamber to treat the substrate.

For example, the vacuum chamber may be a chamber in which a high quality vacuum, for example an ultra high vacuum (UHV), can be provided, for example, by using a particular pump system, for example an UHV pump, connected to the vacuum chamber adapted to evacuate the vacuum chamber. Additionally or alternatively, the vacuum chamber may be a chamber which can be filled with an inert gas in order to prevent any chemical and/or physical reaction with the substrate's surface.

A substrate may be a wafer, for example, a silicon wafer, particularly for fabricating optical discs and/or semiconductor elements and/or photovoltaic cells and/or parts thereof. In an embodiment, the substrate may be brought into the vacuum chamber via a lock. The lock may separate the vacuum chamber from the ambient air and/or from a further chamber, for example, a receiving or pre-vacuum chamber (for example, a "load lock"), and/or a cleaning chamber and/or at least one deposition chamber. As soon as the lock is closed, the vacuum chamber may be evacuated to obtain the best possible vacuum in the vacuum chamber.

The substrate (for example, provided in the vacuum chamber) to be treated in the reaction chamber may be transferred via the transfer chamber into the reaction chamber. For example, the first lock between the vacuum chamber and the transfer chamber is only opened, if the pressure and temperature in the transfer chamber is substantially the same as in the vacuum chamber; for example, the first lock is only opened if the connection between the transfer chamber and the vacuum chamber does not significantly degrade the high quality vacuum (or the properties of the inert gas) in the vacuum chamber. The control of the conditions in the chambers may be performed by a central control unit of the system, for example, comprising a flow controller for controlling the gas flow in a particular chamber or in each chamber. If the gaseous conditions in both chambers are the same, the first lock can be opened manually and/or opens automatically, and the substrate can be transferred into the transfer chamber.

A lock in the sense of the present application may be adapted to provide a connection between a first chamber and a second chamber if it is in its open position, and may be adapted to prevent a fluid (liquid and gaseous) communication between the first chamber and the second chamber if it is in its closed position. The opening and closing of the lock may be controllable from outside the system, for example, manually by a user, and/or may be controlled by a control unit, controlling and/or adjusting the method steps of the whole system, particularly the above-described control unit.

After the first lock is closed, the transfer chamber may be flooded with a particular gas. According to the disclosure, the gas is the same gas as present in the reaction chamber. For example, the gas is supplied from a common gas reservoir for the reaction chamber and the transfer chamber to make sure that the gas in the transfer chamber has the same chemical and physical characteristics as the gas in the reaction chamber. The gas flow and gas quality as well as the pressure and temperature of the gas may be controlled by a controller for one or both chambers, the reaction chamber and the transfer chamber, for example, by means of sensors in the chambers and/or in the supply lines for the gas from the common reservoir. In an embodiment, the controller may be part of any of the above-described control units. In particular, the controller may comprise a flow controller only for controlling the gas flow and gas quality of the gas.

In the reaction chamber, the substrate may be treated, for example, by natural oxidation. A natural oxidation is performed by leaving the substrate for a pre-determined period of time in a well-defined gaseous atmosphere containing oxygen in the reaction chamber so that an oxidation layer is formed on the substrate without using any ionization mechanisms as for example the use of a plasma source or without using ozone.

In an embodiment, the substrate is coated in a deposition chamber with an oxygen-affine material, particularly by using cathodic sputtering, and is then transferred towards the vacuum chamber. For example, the oxygen-affine material which may be deposited onto the substrate in the deposition chamber is a metal, for example, Mg, Al, and/or Hf. Preferably, one deposited metal layer has a thickness of about 0.5 nm to 5.0 nm, in particular 0.5 nm to 2.0 nm.

In an embodiment, and particularly depending on the material of the deposited layer on the substrate, the reaction chamber is filled with gas containing oxygen. For example, the gas may be a mixture of oxygen ($O_2$) and another gas, as for example an inert gas as Argon (Ar), or the gas may be pure oxygen.

In an embodiment, the duration of the treatment of the substrate in the reaction chamber is controlled, and, in particular, the substrate is automatically transferred from the reaction chamber into the transfer chamber after a pre-determined period of time. For example, the above-described control unit or another control unit may be adapted to pre-determine and/or control the duration of the treatment of the substrate, particularly in the oxygen atmosphere. In an embodiment, the step of controlling the duration may also take the time period into consideration in which the substrate is left in the transfer chamber having the same gaseous conditions as the reaction chamber, before and/or after the substrate being transferred into/from the reaction chamber from/into the transfer chamber. For example, even the time period in which the transfer chamber is flooded to have the same gaseous conditions as in the reaction chamber and/or evacuated and/or again flooded (for example, to obtain the same vacuum or the same gaseous conditions as in the vacuum chamber) may at least partly be taken into account to exactly pre-determine the oxidation layer thickness as preferred and as, for example, set by the control unit and/or input in the control unit by a user.

In particular, due to the fact that the vacuum chamber either contains a vacuum or an inert gas or a gas not causing a further oxidation of the substrate, the time frame in which the substrate is actually oxidized in the reaction chamber and (for example, partly) in the transfer chamber is limited and can clearly be defined, for example, to fulfill pre-determined settings regarding the thickness of the oxidation layer on the substrate.

For example, the pressure in the reaction chamber may be about $1 \cdot 10^{-4}$ mbar up to about 10 mbar, particularly $10^{-2}$ mbar to $10^{-1}$ mbar, for example $5 \cdot 10^{-1}$ mbar at room temperature (about 20° C.).

In an embodiment, the substrate is maintained in the reaction chamber for a period of time of about 100 s to 1200 s. For example, if the substrate is already coated with Mg (e.g. Mg layer thickness of about 1.0 nm to 1.5 nm) and then transferred into the reaction chamber, the oxidation time for such a substrate may be between about 300 s to about 600 s.

In an embodiment, after oxidation of a substrate in the reaction chamber, the substrate may be heated, for example to a temperature of about 300° C. For example, the heating may be carried out by one or more heating elements as will be discussed below. Additionally or alternatively, a substrate to be treated in the reaction chamber is simultaneously oxidized and heated in the reaction chamber. For example, the simultaneous oxidation and heating will be carried out for about 100 s to 300 s, preferably about 150 s (for 300° C.), depending on the preferred temperature for the substrate. Still additionally or alternatively, the substrate to be treated in the reaction chamber may already be coated with an oxide layer, for example, by sputtering in the deposition chamber. In this case, it might not be necessary to further oxidize the coated substrate in the reaction chamber, but to only heat the substrate to a pre-determined temperature by heating means in the reaction chamber and/or the transfer chamber.

The present disclosure is also directed to a computer program product comprising one or more computer readable media having computer executable instructions for performing the steps of any of the methods as described above. In particular, the control unit as discussed above may be adapted to perform the method steps by means of the computer program product.

The present disclosure is also directed to a system for treating a substrate, particularly adapted to carry out any of the methods as described above.

The features already discussed in connection with the method of the disclosure may also be features of the system of the disclosure so that their description may also apply to the system as discussed below.

The system comprises a vacuum chamber for receiving and/or transferring a substrate, a reaction chamber for treating the substrate under a controlled gaseous atmosphere, and a transfer chamber arranged between the vacuum chamber and the reaction chamber for receiving the substrate from the vacuum chamber and transferring it into the reaction chamber or vice versa. The system further comprises a first lock between the vacuum chamber and the transfer chamber, and a second lock between the transfer chamber and the reaction chamber. Moreover, the system comprises a controller for controlling the flow of a gas into the transfer chamber to be the same gas as in the reaction chamber, wherein the controller is adapted to control the pressure and temperature of the gaseous atmosphere in the transfer chamber to be the same as in the reaction chamber. In particular, the transfer chamber may comprise heating means and/or a heating element to adjust the desired temperature in the transfer chamber by using the controller.

For example, the system may be provided with appropriate sensors to measure the gas flow in one or each chamber, the quality of the gas, its chemical composition, the temperature and/or the pressure in the chamber. The controller, particularly the flow controller, might be provided together with a control unit as discussed above and may be adapted to control and check the received data from the sensors, and—in particular, if necessary—adjust the process conditions to finally obtain the desired results as, for example, the desired pre-determined thickness of a layer on the substrate.

In an embodiment, the system comprises control means for controlling the duration of treatment of the substrate in the reaction chamber, wherein the control means is adapted to automatically transfer the substrate in the reaction chamber into the transfer chamber after a pre-determined period of time.

For example, the control unit as discussed above may contain the control means for controlling the duration of the treatment of the substrate in the reaction chamber. In particular, the control means may not only rely on the time period in which the substrate was present in the reaction chamber, but may also take the time period into consideration in which the substrate was left in the transfer chamber having the same gaseous conditions as the reaction chamber, before and/or after the substrate being transferred into/from the reaction chamber from/into the transfer chamber. For example, the time period in which the transfer chamber is flooded and/or evacuated may at least partly be taken into account by the control means to adjust the operation process exactly to pre-determined and desired results, as for example a particular oxidation layer thickness on the substrate after being treated in the reaction chamber.

In an embodiment, the system comprises a substrate storage for vertically storing a plurality of substrates in the reaction chamber, and wherein the substrate storage is preferably vertically movable in the reaction chamber. For example, the storage may have a rectangular or circular base area if seen from a top view and a shelf-like structure if seen from a side view to receive several substrates in a vertical and/or horizontal direction. In doing so, a plurality of substrates may be treated at the same time in the reaction chamber, thus saving overall process time to treat the substrates.

The substrate storage may be vertically movable in the reaction chamber (as an elevator), for example, to facilitate transfer of the substrates into the reaction chamber. For example, in an embodiment, the system comprises a transport mechanism in the transfer chamber, wherein the transport mechanism is adapted to transfer and/or receive at least one substrate to/from the substrate storage from/into the transfer chamber. For example, the operation of the transport mechanism and the substrate storage may be dependent on each other, so that the movements of the transport mechanism can be adapted to the movements of the substrate storage and/or vice versa. In doing so, the transfer of the substrates can be accelerated so that the overall process time is further reduced.

The substrate storage may further comprise one or more heating elements, for example, at different levels of the storage. In an embodiment, each shelf in the storage may be provided with a heating element contacting the shelf from below and/or being arranged between a shelf and a substrate stored on the shelf. In particular, a substrate stored on a shelf in the storage may be heated from below and/or from above, for example, by alternatively or additionally operating the heating element of the adjacent shelf above. In any case, each heating element may be operated separately and controlled by the above-described controller or control unit to optimally adjust a well-defined temperature of the substrate to be treated in the reaction chamber. In particular, the temperature of the substrate can be adjusted to be homogenous on the substrate surface to be treated and/or the temperature of the substrates stored in the storage may be adjusted to be the same for each substrate and/or may be different for one or more pre-defined substrates in the storage. In an embodiment, the temperature range generated by the heating elements may be 100° C. to 800° C., particularly 200° C. to 600° C., preferably about 300° C.

Additionally or alternatively, the substrate storage may be arranged in an isothermal box having an opening for receiving the substrates. The isothermal box is provided with one or more heating elements, for example arranged outside the isothermal box, and particularly contacting the isothermal box. Each heating element may be operated separately and controlled by the above-described controller or control unit to obtain the desired temperature distribution in the isothermal box. In an embodiment, the heating element may be a heating coil and/or one or more heating plates.

Each shelf of the storage may comprise or constitute a thermal shield so that a temperature difference between a substrate just stored on a particular shelf in the storage (and/or stored between two shelves in the storage) and a substrate having been previously stored in the storage for some time period and already having the desired temperature does not negatively affect the temperature of the previously stored substrate.

In an embodiment, the reaction chamber housing the substrate storage may be provided with a thermal reflector such as one or more metal plates, particularly on the reaction chamber's inner surface to further support the operation of the heating elements. In an embodiment, the reaction chamber may have a polished inner surface.

As an example, the distribution of the substrates in the storage may be controlled by using a particular software and/or may be performed randomly while a particular software controls the (oxidation) process and/or the atmospheric and/or the temperature conditions in the reaction chamber.

In an embodiment, the control unit as discussed above may be adapted to control the duration of treatment of different substrates, for example, according to pre-determined settings, so that it is advantageously possible to individually treat a plurality of substrates at the same time for different durations.

In an embodiment, the system comprises at least one deposition chamber for depositing at least one layer onto the substrate, wherein a deposition chamber lock is provided between the vacuum chamber and at least one of the deposition chambers for transferring the substrate into and/or out of the deposition chamber. For example, it might be advantageous to first of all coat the substrate to be treated in the reaction chamber, wherein the coating may take place in the deposition chamber. In particular, an oxygen-affine layer may be deposited onto the substrate, and the substrate is then treated in an oxygen-containing atmosphere in the reaction chamber to form an oxide layer on the (coated) substrate.

In an embodiment, the system comprises a receiving chamber for initially receiving the substrate to be treated in the system, wherein a first receiving chamber lock is provided at the receiving chamber's ambient side and a second receiving chamber lock is provided between the receiving chamber and the vacuum chamber. The receiving chamber may be a pre-vacuum chamber to receive a substrate from the ambient air and to apply a fast pre-vacuum to it, before the substrate is further transferred into the vacuum chamber preferably having a higher quality vacuum. By using such a receiving chamber, the process time can further be reduced, particularly due to the pre-vacuum which can be achieved by a fast pre-vacuum pump connected to the receiving chamber.

Additionally or alternatively, the system may also comprise a cleaning chamber connected via a cleaning chamber lock to the vacuum chamber. For example, a plasma process may be carried out in the cleaning chamber to remove organic contaminations on the substrate, particularly before the substrate is further processed in the deposition chamber and/or in the reaction chamber.

Features of particular embodiments and considerations in connection with the present disclosure are discussed in the following.

DETAILED DESCRIPTION OF THE PREFERRED EMBODIMENT

Figure 1:
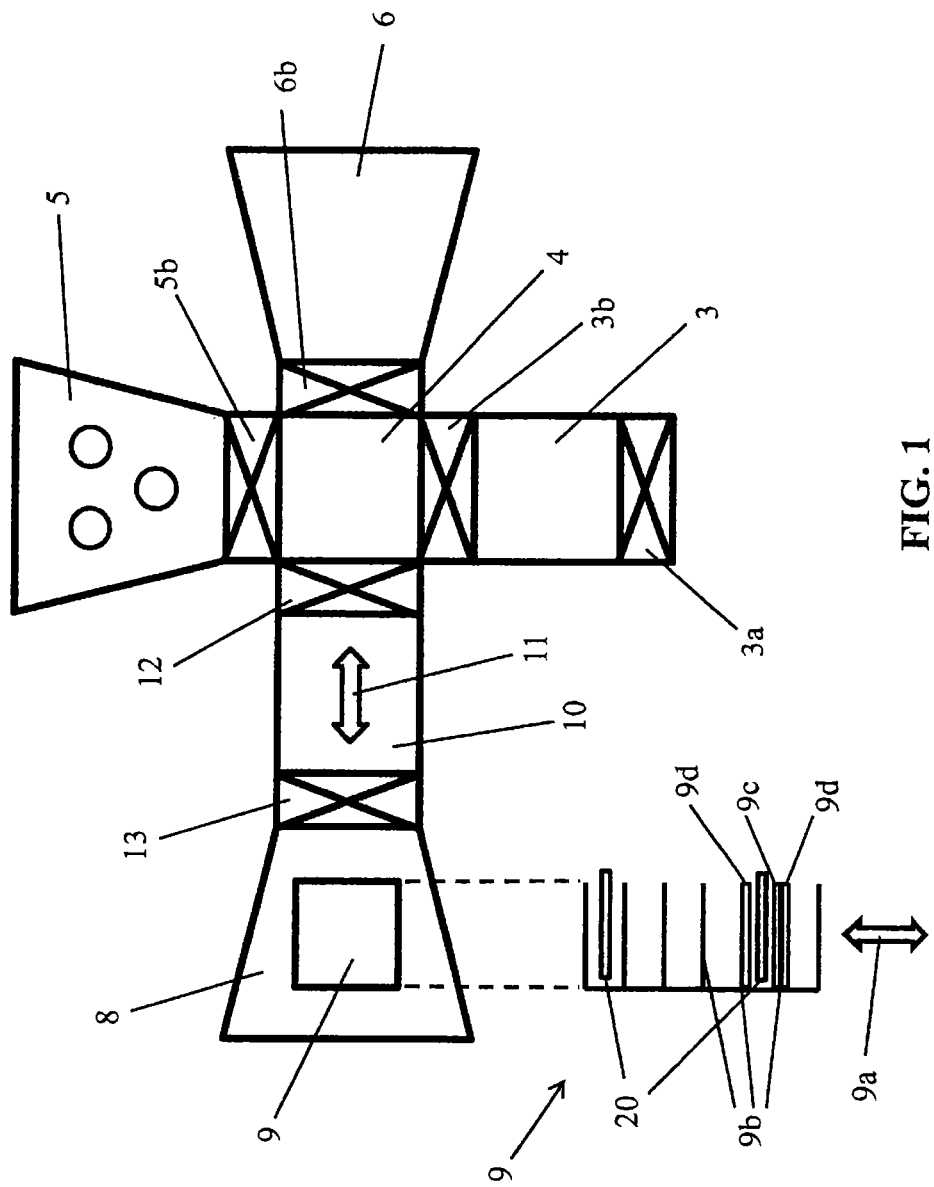
FIG. 1 schematically shows a system of the present disclosure, for treating a substrate in a reaction chamber, and FIG. 2 schematically shows a reaction chamber in a system of the present disclosure.

In particular, FIG. 1 schematically shows a system, seen from a top view, with a transfer chamber 10 arranged between a reaction chamber 8 and a vacuum chamber 4. A substrate provided in the vacuum chamber 4 can be transferred to the transfer chamber 10 via a first lock 12, and may further be transferred to the reaction chamber 8 via a second lock 13 by means of a transport mechanism 11 arranged in the transfer chamber 10. The reaction chamber 8 contains a storage 9 for a plurality of substrates 20 which may be vertically and/or horizontally stored in the storage 9. In particular, seen from a side view of the storage 9 as shown in the lower part of FIG. 1, the substrate storage 9 may have a shelf-like structure to store at least one substrate 20. As indicated by the arrow 9a, the substrate storage 9 may be vertically movable within the reaction chamber 8, for example, to facilitate a fast transfer of a particular substrate 20 into and/or from the storage 9 from and/or into the transfer chamber 10. In an example, the storage 9 may also be horizontally movable in the reaction chamber 8, particularly if several substrates 20 are provided horizontally in the storage 9.

The system may further comprise at least one deposition chamber 5 for depositing a layer or several layers onto a substrate (that means for coating the substrate with one or more layers), for example, by cathodic sputtering or any other method known in this technical field. In an embodiment, the coating is carried out in a first deposition chamber to deposit a first layer, then the substrate may be coated with a second (different) layer in the same deposition chamber (but by using a different target) or by having been transferred to a second deposition chamber (for example, via a lock between the deposition chambers) and so on. In an example, the layer deposition(s) onto the substrate may take place before the substrate is then transferred via the deposition chamber lock 5b, through the vacuum chamber 4, the first lock 12, and the transfer chamber 10 into the reaction chamber 8 via the second lock 13. Additionally or alternatively, after being treated in the reaction chamber 8, the substrate may be transferred to the deposition chamber(s) 5 and then be (additionally) coated.

In an embodiment, the system comprises a cleaning chamber 6 connectable to the vacuum chamber via a cleaning chamber lock 6b. In the cleaning chamber 6, a substrate may be cleaned before being processed in the reaction chamber and/or the deposition chamber(s) 5. The cleaning of the substrate may be carried out by using a plasma method to remove, for example, organic contamination from the substrate. In some cases, it might also be useful to carry out a cleaning of the substrate in the cleaning chamber 6 between several process steps, for example, before deposition of one or more layers onto the substrate, after such a deposition to clean the substrate before its treatment in the reaction chamber 8, and/or after the treatment in the reaction chamber 8 to clean the substrate before a possibly further coating in one or more of the deposition chambers 5.

Further, the system may comprise a receiving chamber 3 into which one or more substrates may be brought into the whole system via a first receiving chamber lock 3a. The receiving chamber 3 is connectable to the vacuum chamber 4 via a second receiving chamber lock 3b. The receiving chamber 3 may be adapted to provide a pre-vacuum atmosphere, for example, in order to shorten the time to achieve an appropriate vacuum in the vacuum chamber 4 compared to the case where the substrate is directly brought into the vacuum chamber 4 from the ambient atmosphere outside the system. For example, the receiving chamber 3 may be connected to a pre-vacuum pump achieving a pre-vacuum in a very short time period, whereas the vacuum chamber 4 may be connected to a vacuum pump of, for example, higher quality to finally achieve optimized vacuum conditions in the vacuum chamber 4.

For example, the system may be used as follows, wherein one or more of the elements 3, 3a, 5, 5b, 6, 6b, 9, and 11 and the method steps involving these elements are not necessary for carrying out some embodiments of the method of the present disclosure.

A substrate is brought into the system via a first receiving lock 3a of a receiving chamber 3. After having received the substrate in the receiving chamber 3, the first receiving chamber lock 3a is closed and a pre-vacuum pump may be used to obtain a pre-vacuum in the receiving chamber 3, while a second receiving chamber lock 3b remains closed. The second receiving chamber lock 3b connects the receiving chamber 3 to a vacuum chamber 4, into which the substrate may be transferred after the pre-vacuum is achieved in the receiving chamber 3. For that purpose, the second receiving chamber lock 3b is opened to provide/transfer the substrate into the vacuum chamber 4. After having closed the second receiving chamber lock 3b, the vacuum chamber 4 may be further evacuated by using, for example, a high quality vacuum pump. Before and/or after evacuation of the vacuum chamber 4, for example, with reference to a pre-determined pressure threshold, the substrate may be cleaned in the cleaning chamber 6 into which the substrate may be transferred via a cleaning chamber lock 6b connecting the cleaning chamber 6 and the vacuum chamber 4. For example, during the transfer of the substrate into the cleaning chamber, the cleaning chamber 6 may have essentially the same vacuum as the vacuum chamber 4. During cleaning of the substrate, for example, by a plasma method, the gaseous atmosphere in the cleaning chamber 6 may change, and the substrate may only be transferred to the vacuum chamber 4 again, if the cleaning chamber 6 again has essentially the same vacuum conditions as present in the vacuum chamber 4. Back in the vacuum chamber 4, the vacuum chamber 4 may be evacuated to obtain the optimal atmosphere conditions as possible. For example, an UHV pump may permanently evacuate the vacuum chamber 4 in order to obtain the desired atmospheric conditions. The substrate may be further transferred to at least one deposition chamber 5 via deposition chamber lock 5b, in order to coat the substrate with one or more layers. For example, during the transfer of the substrate into the deposition chamber 5 and back into the vacuum chamber 4, the deposition chamber has essentially the same vacuum as present in the vacuum chamber 4, whereas the gaseous atmosphere during the deposition process in the deposition chamber 5 may change.

After and/or before the deposition of one or more layers onto the substrate, the substrate may be treated in a reaction chamber 8: for example, the substrate provided in the vacuum chamber 4 can be transferred via a first lock 12 into a transfer chamber 10, for example, if the gaseous atmosphere is the same as in the vacuum chamber 4. Then, the first lock 12 is closed and the transfer chamber 10 is flooded with the same gas as present in the reaction chamber 8. For example, both the reaction chamber 8 and the transfer chamber 10 may be connected to the same gas reservoir, wherein the gas supply line (not shown) of each of the chambers 8, 10 may be individually lockable, for example, to prevent pressure variations in the reaction chamber 8, if the reaction chamber 8 is already filled with a particular amount of gas, and the transfer chamber 10 is still in the flooding process. A controller may control that the gas in the transfer chamber 10 is the same gas and with the same properties as present in the reaction chamber 8, for example, the controller may be adapted to control and adjust the pressure and temperature of the gaseous atmosphere in the transfer chamber 10 to be the same as in the reaction chamber 8. The transfer chamber 10 may contain a transport mechanism 11 to receive the substrate from the vacuum chamber 4 and to transfer the substrate into the reaction chamber 8. The transfer mechanism may be operated by a user outside the system and/or may operate automatically, for example, if a particularly pre-determined condition in the transfer chamber 10 (for example, the correct pressure and temperature of the gaseous atmosphere) is achieved. That means, in one embodiment, the transfer mechanism 11 may be coupled to the controller, and the controller may control the operation of the transfer mechanism. As soon as the controller detects that the gaseous conditions in the transfer chamber 10 is the same as in the reaction chamber 8, the second lock 13 may be opened to transfer the substrate into the reaction chamber 8. In an embodiment, a bypass between the reaction chamber 8 and the transfer chamber 10 may be provided, for example, to adapt the gaseous conditions in these two chambers 8, 10 immediately before the second lock 13 is opened. However, depending on the quality of the controller and its reliability, such a bypass may not be necessary.

The substrate 20 may be placed in a substrate storage 9 arranged in the reaction chamber 8. The substrate storage 9 may be adapted to store a plurality of substrates particularly in a vertical direction and/or in a horizontal direction on several shelves 9b and may be vertically and/or horizontally movable within the reaction chamber 8 to facilitate receiving each substrate in the storage. For example, as soon as a further substrate provided in the vacuum chamber 4 is to be stored in the storage 9 on a shelf 9b of the storage 9, the second lock 13 is closed, the transfer chamber 10 is evacuated to have the same vacuum as in the vacuum chamber 4, the first lock 12 is opened and the further substrate is transferred into the transfer chamber 10. As soon as the conditions are appropriate to open the second lock 13, the further substrate is transferred into the reaction chamber 8, for example, while the substrate storage 9 moves within the reaction chamber 8, so that the transport mechanism 11 can easily put the substrate into the substrate storage 9.

The controller and/or the control unit as discussed above may be adapted to determine and/or record, which substrate was placed in a particular chamber, particular in the storage 9 (and at what exact location in the storage 9), and at what particular time, so that it is preferably possible to identify each substrate in the system at any time.

In doing so, it is possible to know the exact location of each substrate in the whole system and/or the exact position of the substrate in the storage 9. Additionally, the duration of the presence of a substrate in a particular location, for example, how long a particular substrate is present/treated in the reaction chamber 8, can be watched, adjusted and/or recorded according to pre-determined settings.

The storage 9 may be provided with one or more heating elements 9c, 9d. For example, each shelf 9b in the storage 9 may be provided with a heating element 9d contacting the shelf 9b from below and/or from above, for example, with a heating element 9c arranged between the shelf 9b and the substrate 20 stored on the shelf 9b. A substrate 20 stored on a shelf 9b may be heated from below and/or from above, for example, by alternatively or additionally operating the heating element 9d of the adjacent shelf 9b above. Each heating element 9c, 9d may be operated separately and controlled to optimally adjust a well-defined temperature of the substrate 20 to be treated in the reaction chamber 8.

In an embodiment, the reaction chamber 8 is filled with a gas containing oxygen, so that a substrate present in the reaction chamber 8 will be oxidized. For example, the substrate may already been coated with a thin layer as discussed above, wherein the thin layer may have a thickness of about 1 nm to 2 nm. Due to an exact determination how long the substrate is present in the reaction chamber 8 and/or how long the substrate is oxidized if additionally considering the time frame in which the substrate was present in the transfer chamber 10 during its flooding with the gas containing oxygen, the thickness of the oxide layer on the substrate can be adjusted. Further, since the oxidation of the substrate is a "natural" oxidation, meaning that ionization mechanisms like the use of a plasma source and/or the use of ozone are not carried out in the reaction chamber, the oxide layer is a high quality oxide layer.

If necessary, the reaction chamber 8 may be evacuated by means of a vacuum pump (not shown), e.g. a thermomolecular pump or a cryo pump connected to the reaction chamber 8.

Figure 2:
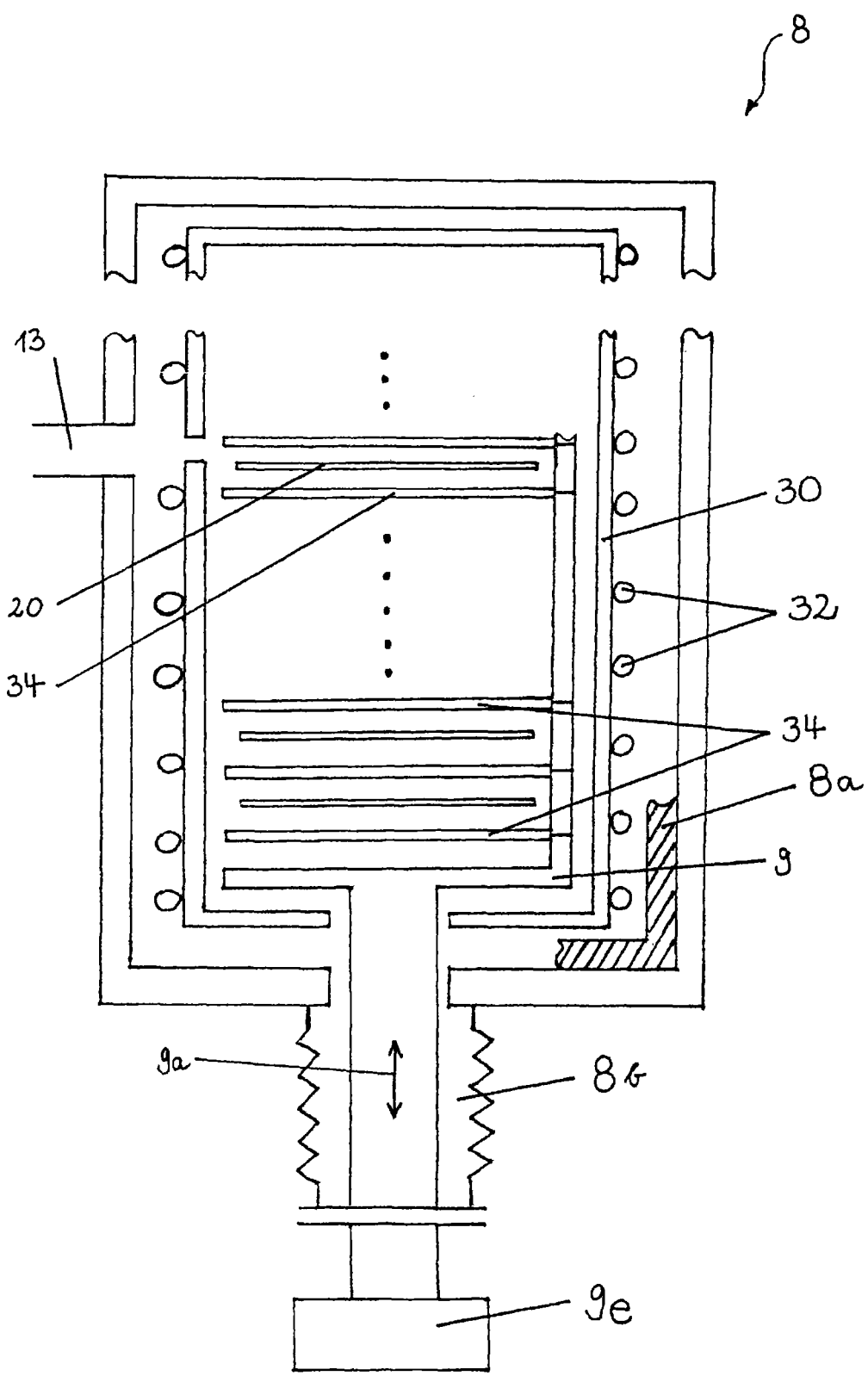

FIG. 2 schematically shows a reaction chamber 8, seen from a side view, which may be the same or a different reaction chamber 8 as shown in FIG. 1. A substrate 20 is transferred into the reaction chamber 8 via the second lock 13 and stored in the substrate storage 9. The substrate storage 9 may have several thermal shields 34, for example provided as shelves of storage 9. In particular, a substrate 20 may be placed between two thermal shields 34 in order to shield the environment against a possibly too high or too low temperature of a just received substrate compared to substrates previously stored in the storage 9 for some period of time. The storage 9 may be provided in an isothermal box 30 having heating elements 32 on its outer surface to obtain the desired temperature for the stored substrates 20. The heating elements may be controlled separately by a control unit as discussed above. In order to support the operation of the heating elements 32, the reaction chamber's inner surface may be provided with a thermal reflector 8a, for example having a polished surface reflecting the thermal radiation from the heating elements 32. As discussed above, the substrate storage 9 may be vertically movable as indicated by the arrow 9a in order to easily receive any substrate 20 to be stored in the storage 9 from the transfer chamber via the second lock 13. The movement of the storage 9 may be achieved by providing a motor 9e which may be arranged outside the reaction chamber 8. Further, as shown in the lower part of FIG. 2, a shaft with a bellows 8b may connect the reaction chamber 8, the storage 9, and the motor 9e so that any movement of the storage 9 within the reaction chamber 8 does not negatively affect the atmospheric conditions in the reaction chamber 8.

In view of the foregoing, the present disclosure provides a method and system in which a particularly well-defined gaseous atmosphere in a reaction chamber can be maintained even if one or more substrates are transferred into and/or from the reaction chamber in a further chamber so that it is possible to control and precisely pre-determine the duration of treatment of a substrate in the particular gaseous atmosphere and to individually treat a plurality of substrates at the same time for different durations.

While the disclosure has been illustrated and described in detail in the drawing and foregoing description, such illustration and description are to be considered illustrative or exemplary and non-restrictive. The disclosure is thus not limited to the disclosed embodiments. Variations to the disclosed embodiments can be understood and effected by those skilled in the art and practicing the claimed disclosure, from a study of the drawing, the disclosure, and the appended claims. In the claims, the word 'comprising' does not exclude other elements or steps, and the indefinite article 'a' or 'an' does not exclude a plurality. A single processor or other unit may fulfill the functions of several items recited in the claims. The mere fact that certain measures are recited in mutually different dependent claims does not indicate that a combination of these measures cannot be used to advantage.

What is claimed is:

1. System for treating substrates comprising:
    a vacuum chamber for receiving and/or transferring at least one of said substrates,
    a reaction chamber for treating a plurality of said substrates under a controlled gaseous atmosphere, and with a substrate storage for vertically storing the plurality of said substrates in the reaction chamber,
    a transfer chamber arranged between the vacuum chamber and the reaction chamber for receiving the at least one of said substrates from the vacuum chamber and transferring it into the reaction chamber or vice versa,
    a first lock between the vacuum chamber and the transfer chamber,
    a second lock between the transfer chamber and the reaction chamber,
    a controller for controlling the flow of a gas into the transfer chamber to be the same gas as in the reaction chamber, wherein the controller is adapted to control the pressure and temperature of the gaseous atmosphere in the transfer chamber to be the same as in the reaction chamber, and
    a transport mechanism in the transfer chamber, wherein the transport mechanism is adapted to transfer and/or receive the at least one of said substrates to/from the substrate storage from/into the transfer chamber,
    wherein the gaseous atmosphere in the reaction chamber can be maintained when the second lock is opened and the at least one of said substrates is transferred into the reaction chamber and/or from the reaction chamber into the transfer chamber, such that treatment in the reaction chamber can be performed uninterrupted, and
    wherein the duration of treatment of the plurality of said substrates in the gaseous atmosphere in the reaction chamber can be controlled and pre-determined, such that the plurality of said substrates in the reaction chamber can be individually treated at the same time for different durations.

2. System of claim 1, further comprising control means for controlling the duration of treatment of each substrate individually in the reaction chamber, wherein the control means is adapted to automatically transfer the respective substrate from the reaction chamber into the transfer chamber after a pre-determined period of time.

3. System of claim 1, wherein the substrate storage is vertically movable in the reaction chamber.

4. System of claim 1, wherein said substrate storage comprises one or more heating elements and/or is provided in an isothermal box having one or more heating elements.

5. System of claim 1, further comprising at least one deposition chamber for depositing at least one layer onto the at least one of said substrates, wherein a deposition chamber lock is provided between the vacuum chamber and at least one of the deposition chambers for transferring the at least one of said substrates into and/or out of the deposition chamber.

6. System of claim 1, further comprising a receiving chamber for initially receiving the at least one of said substrates to be treated in the system, wherein a first receiving chamber lock is provided at the receiving chamber's ambiance side and a second receiving chamber lock is provided between the receiving chamber and the vacuum chamber.

* * * * *